US012720650B2

(12) United States Patent
Yamamoto et al.

(10) Patent No.: US 12,720,650 B2
(45) Date of Patent: Aug. 25, 2026

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Katsuhiko Yamamoto, Toyama (JP); Keishin Yamazaki, Toyama (JP); Shinya Sasaki, Toyama (JP); Noriaki Michita, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 818 days.

(21) Appl. No.: 18/168,115

(22) Filed: Feb. 13, 2023

(65) Prior Publication Data

US 2023/0189407 A1 Jun. 15, 2023

Related U.S. Application Data

(63) Continuation of application No. PCT/JP2021/032613, filed on Sep. 6, 2021.

(30) Foreign Application Priority Data

Sep. 9, 2020 (JP) ................................ 2020-151579

(51) Int. Cl.
*H05B 6/80* (2006.01)
*H10P 14/20* (2026.01)

(52) U.S. Cl.
CPC ........... *H05B 6/80* (2013.01); *H10P 14/3802* (2026.01); *H05B 2206/044* (2013.01); *H10P 14/3411* (2026.01); *H10P 14/3454* (2026.01)

(58) Field of Classification Search
CPC .... H05B 6/80; H05B 2206/044; H05B 6/763; H05B 6/6455; H05B 6/707;
(Continued)

(56) References Cited

U.S. PATENT DOCUMENTS

2014/0283734 A1 9/2014 Monden et al.
2018/0211840 A1 7/2018 Yamaguchi et al.
(Continued)

FOREIGN PATENT DOCUMENTS

CN 107924826 A 4/2018
JP S61-43417 A 3/1986
(Continued)

OTHER PUBLICATIONS

International Search Report, PCT/JP2021/032613, Oct. 5, 2021, 5 pgs.

(Continued)

*Primary Examiner* — Robert G Bachner
(74) *Attorney, Agent, or Firm* — Volpe Koenig

(57) ABSTRACT

There is provided a technique, which includes: a process chamber where a substrate is processed; a microwave oscillator configured to supply microwaves to the process chamber; and a controller configured to be capable of controlling the microwave oscillator to perform: a heating process where the substrate is heated with a first microwave, among the supplied microwaves, supplied at a first microwave power so that a process of supplying the first microwave during a supply time and a process of stopping the supply of the first microwave during a stop time shorter than the supply time are performed a predetermined number of times or for a first predetermined time; and a modifying process in which the substrate is supplied with a second microwave, among the supplied microwaves, at a second microwave power higher than the first microwave power for a second (Continued)

predetermined time while maintaining the second microwave power.

21 Claims, 5 Drawing Sheets

(58) Field of Classification Search
CPC ......... H01L 21/02667; H01L 21/02532; H01L 21/02592; H01L 21/67115; H01L 21/67748; H01L 21/67754; H01L 21/268; H01L 21/31; H01L 21/324
See application file for complete search history.

(56) References Cited

U.S. PATENT DOCUMENTS

2019/0295873 A1* 9/2019 Hirochi ............. H01L 21/67742
2020/0013646 A1* 1/2020 Sasaki ............... H01L 21/67248

FOREIGN PATENT DOCUMENTS

JP 2014-187274 A 10/2014
JP 2015-070045 A 4/2015
WO 2017/056148 A1 4/2017

OTHER PUBLICATIONS

Chinese Office Action issued on Jan. 6, 2026 for Chinese Patent Application No. 202180041030.5.

* cited by examiner

Figure 5:
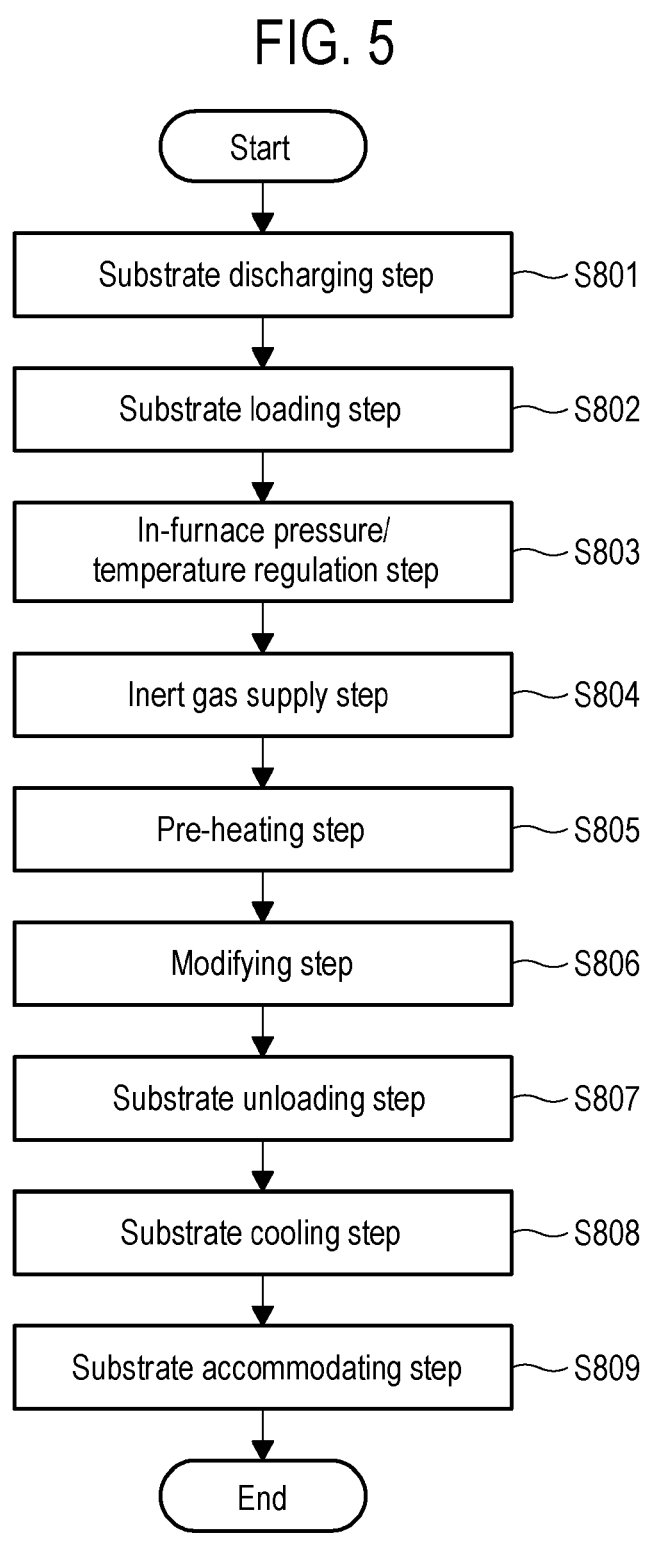

Start

Substrate discharging step — S801

Substrate loading step — S802

In-furnace pressure/ temperature regulation step — S803

Inert gas supply step — S804

Pre-heating step — S805

Modifying step — S806

Substrate unloading step — S807

Substrate cooling step — S808

Substrate accommodating step — S809

End

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2021/032613, filed on Sep. 6, 2021, the international application being based upon and claiming the benefit of priority from Japanese Patent Application No. 2020-151579, filed on Sep. 9, 2020, the entire contents of which are incorporated herein by reference.

TECHNICAL FIELD

The present disclosure relates to a substrate processing apparatus, a method of manufacturing a semiconductor device, and a recording medium.

BACKGROUND

As a process of manufacturing a semiconductor device, for example, there is a modifying process represented by an annealing process in which a substrate in a process chamber is heated by a heater to change a composition or crystal structure of a thin film formed on a surface of the substrate, or to repair crystal defects and the like in the thin film formed on the surface of the substrate. In the up-to-date semiconductor devices, miniaturization and high integration of semiconductor devices become remarkable. Along with this, there is a demand for a modifying process on a high-density substrate on which a pattern with a high aspect ratio is formed. As a modifying process on such a high-density substrate, a heat treatment method in which electromagnetic waves are used is studied.

In the related art, when a process using electromagnetic waves is performed, warpage or cracking of a substrate may occur due to non-uniformity of an in-plane temperature of the semiconductor substrate during a heat treatment.

SUMMARY

Some embodiments of the present disclosure provide a technique capable of preventing warpage or cracking of a substrate due to a heat treatment.

According to some embodiments of the present disclosure, there is provided a technique that includes: a process chamber in which a substrate is processed; a microwave oscillator configured to supply microwaves to the process chamber; and a controller configured to be capable of controlling the microwave oscillator to perform: a heating process in which the substrate is heated with a first microwave, among the supplied microwaves, supplied at a first microwave power so that a process of supplying the first microwave during a supply time and a process of stopping the supply of the first microwave during a stop time, which is shorter than the supply time, are performed a predetermined number of times or for a first predetermined time; and a modifying process in which the substrate is supplied with a second microwave, among the supplied microwaves, at a second microwave power, which is higher than the first microwave power, for a second predetermined time while maintaining the second microwave power.

BRIEF DESCRIPTION OF DRAWINGS

The accompanying drawings, which are incorporated in and constitute a part of the specification, illustrate embodiments of the present disclosure.

FIG. 4 is a schematic structure diagram of a controller of a substrate processing apparatus according to embodiments of the present disclosure.

FIG. 5 is a diagram showing an example of a substrate processing flow according to embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the present disclosure will be described below with reference to the drawings. The embodiments of the present disclosure are directed to a substrate processing apparatus that includes a process chamber in which a substrate is processed, a microwave oscillator configured to supply microwaves to the process chamber, and a controller configured to be capable of controlling the microwave oscillator to perform: a heating process in which the substrate is heated by being supplied with the microwaves so that while the microwaves are maintained at a first microwave power, a process of supplying the microwaves during a supply time and a process of stopping the supply of the microwaves during a stop time, which is shorter than the supply time, are performed a predetermined number of times or for a predetermined time; and a modifying process in which the substrate is modified by being supplied with the microwaves during a predetermined time while the microwaves are maintained at a second microwave power, which is higher than the first microwave power. Further, the embodiments of the present disclosure are directed to a method of manufacturing a semiconductor device and a program using the substrate processing apparatus.

(1) Structure of Substrate Processing Apparatus

The substrate processing apparatus according to the embodiments of the present disclosure is constituted as a single-substrate heat treatment apparatus that performs various types of heat treatment on one or more wafers, and will be described as an apparatus that performs an annealing process (modifying process) by using electromagnetic waves described below. In the substrate processing apparatus according to the embodiments of the present disclosure, a FOUP (Front Opening Unified Pod: hereinafter referred to as a pod) is used as a storage container (carrier) that accommodates wafers as substrates therein. The pod is also used as a transfer container configured to transfer wafers among various substrate processing apparatuses.

Figure 1:
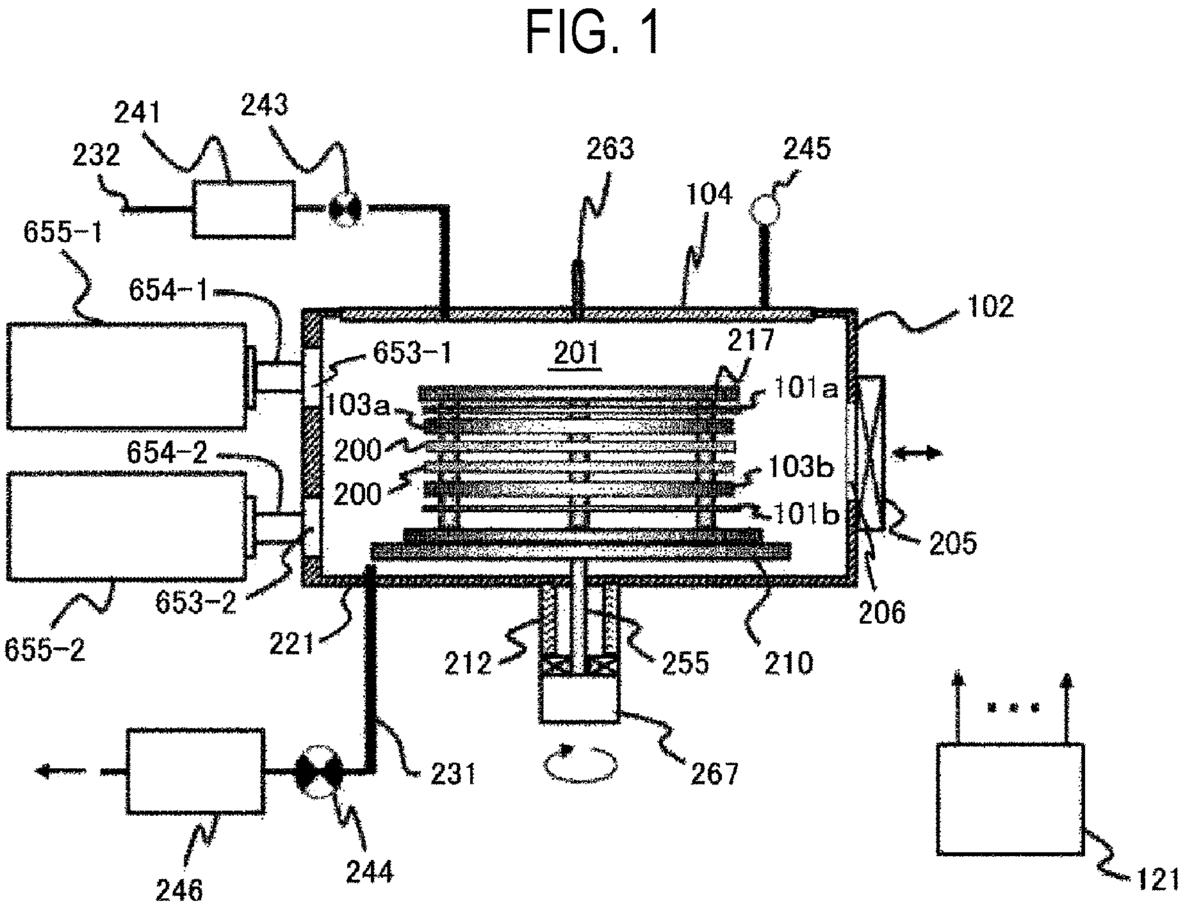
FIG. 1 is a schematic structure diagram showing a process furnace of a substrate processing apparatus according to embodiments of the present disclosure in a vertical sectional view.
Figure 2:
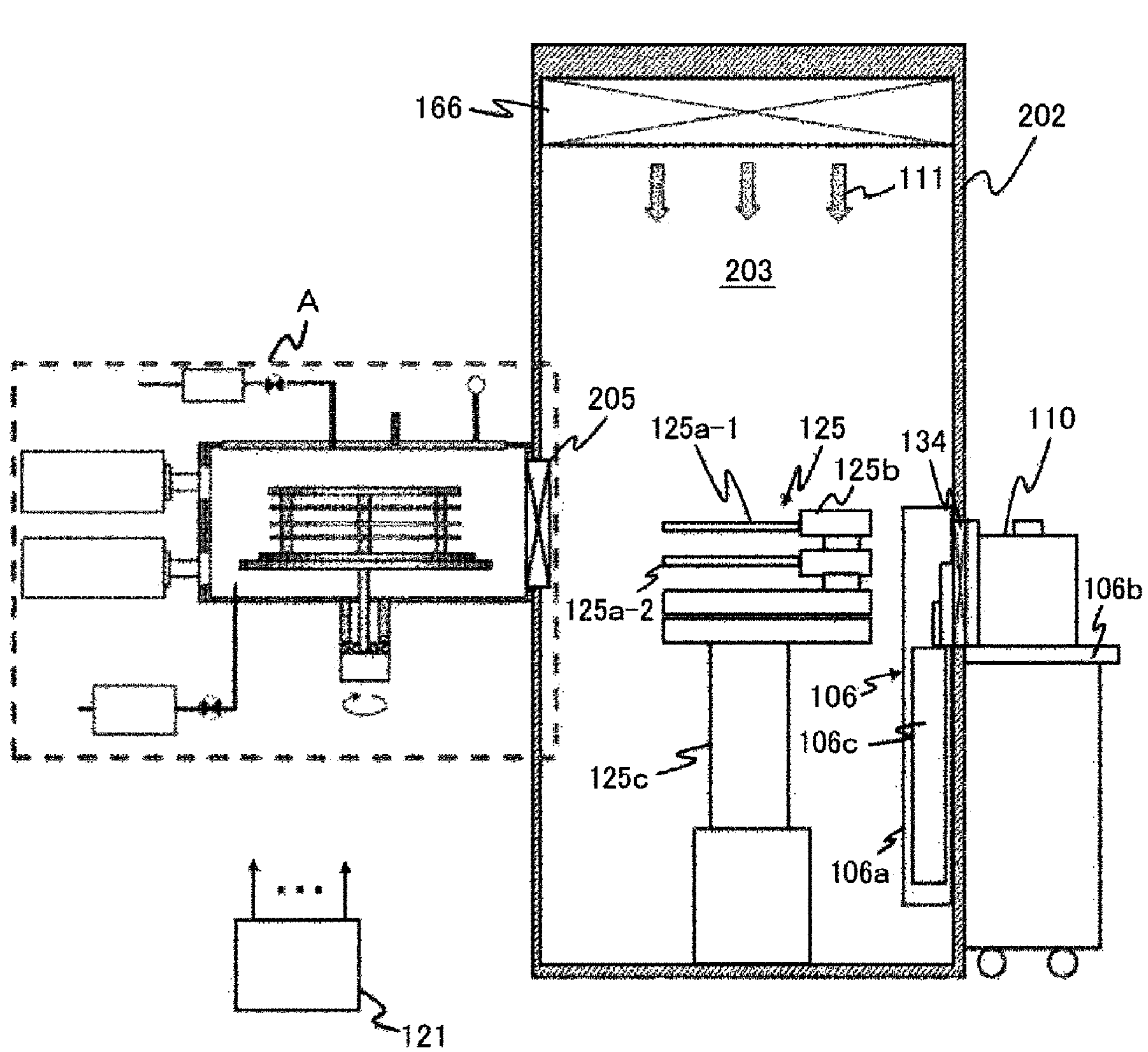
FIG. 2 is a vertical sectional view showing a schematic structure of the substrate processing apparatus according to embodiments of the present disclosure at a position of a process furnace.
Figure 3:
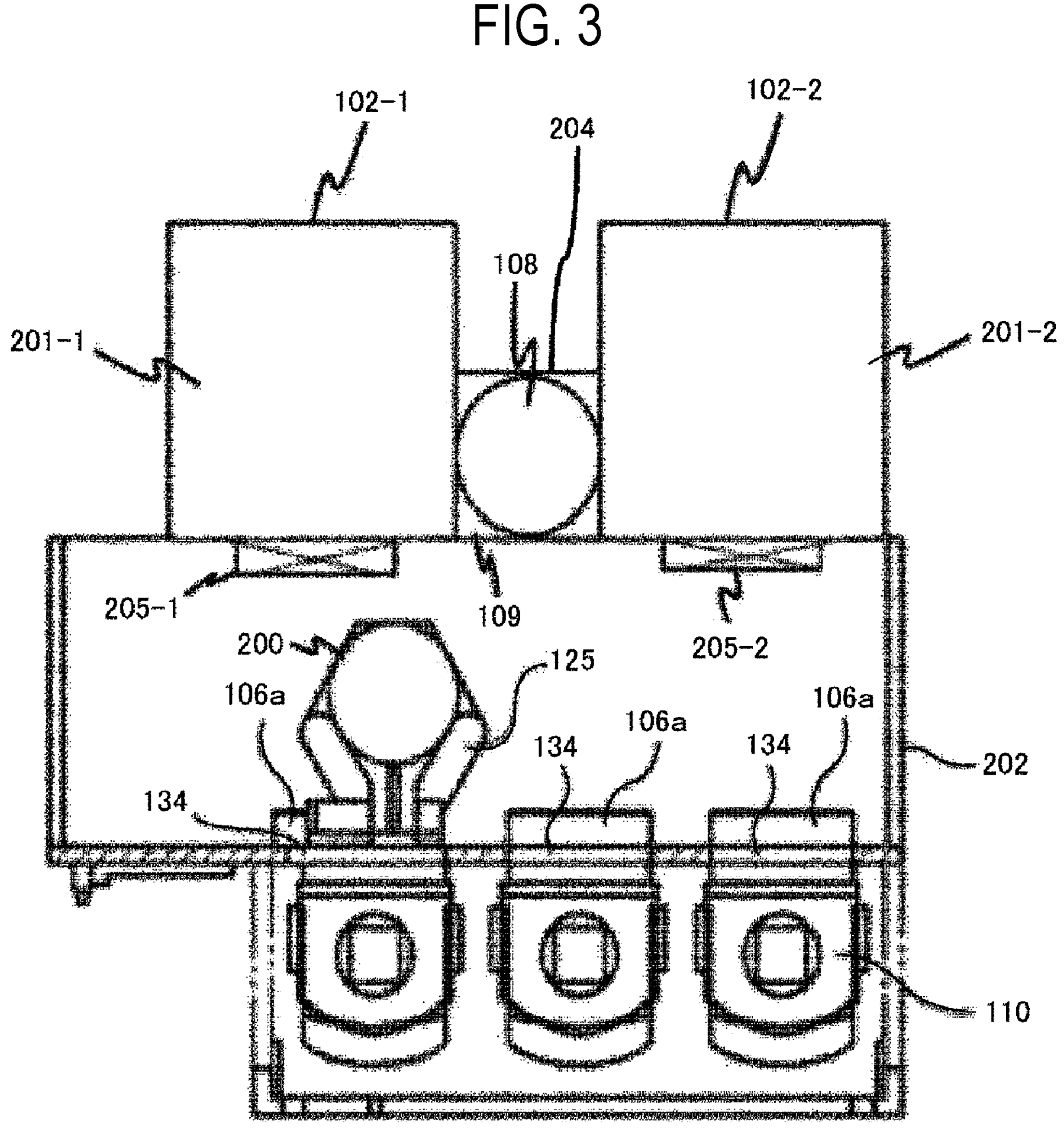
FIG. 3 is a horizontal sectional view showing a cross-sectional structure of a substrate processing apparatus according to embodiments of the present disclosure.

As shown in FIGS. 1, 2 and 3, the substrate processing apparatus 100 includes a transfer housing 202 including therein a transfer chamber 203 configured to transfer a wafer 200, and cases 102-1 and 102-2 as below-described process containers, which are installed at a side wall of the transfer housing 202 and include therein process chambers 201-1 and 201-2 in which the wafer 200 is processed respectively. In addition, a cooling case 109 forming a cooling chamber 204 is installed between the process chambers 201-1 and 201-2.

A load port unit (LP) 106 as a pod opening/closing mechanism configured to open or close a lid of a pod 110 and load or unload the wafer 200 into or out of the transfer chamber 203 is arranged on the right side in FIG. 2 (the lower side in FIG. 3), which is the front side of the transfer housing 202. The load port unit 106 includes a housing 106*a*, a stage 106*b*, and an opener 106*c*. The stage 106*b* is configured to mount the pod 110 thereon and bring the pod 110 closer to a substrate loading/unloading port 134 formed in front of the housing of the transfer chamber 203. The lid (not shown) installed on the pod 110 is opened or closed by the opener 106*c*. Further, the load port unit 106 may perform a function capable of purging the inside of the pod 110 with a purge gas such as a $N_2$ gas. In addition, the transfer housing 202 is formed in a below-described purge gas circulation structure configured to circulate a purge gas such as $N_2$ in the transfer chamber 203.

Gate valves (GV) 205-1 and 205-2 configured to open or close the process chambers 201-1 and 201-2 are respectively arranged on the left side in FIG. 2 (the upper side in FIG. 3), which is the rear side of the transfer housing 202. In the transfer chamber 203, a substrate transfer robot, which is a substrate transfer mechanism configured to transfer the wafer 200, and a transfer machine 125 as a substrate transfer are installed. The transfer machine 125 includes tweezers (arms) 125*a*-1 and 125*a*-2 as mounters configured to mount the wafer 200, a transfer 125*b* capable of horizontally rotating or linearly moving each of the tweezers 125*a*-1 and 125*a*-2, and a transfer elevator 125*c* configured to raise or lower the transfer 125*b*. By the continuous operation of the tweezers 125*a*-1 and 125*a*-2, the transfer 125*b*, and the transfer elevator 125*c*, the wafer 200 may be charged into and discharged from the below-described substrate holder (substrate holding part) 217, the cooling chamber 204, and the pod 110. Hereinafter, the cases 102-1 and 102-2, the process chambers 201-1 and 201-2, and the tweezers 125*a*-1 and 125*a*-2 are simply referred to as a case 102, a process chamber 201, and a tweezer 125*a* respectively, in a case where they may not be distinguished from each other while being described respectively.

The tweezer 125*a*-1 is made of ordinary aluminum and is used to transfer a wafer at a low temperature and a room temperature. The tweezer 125*a*-2 is made of material such as alumina or quartz with high heat resistance and poor thermal conductivity, and is used when transferring a wafer at a high temperature and a room temperature. In other words, the tweezer 125*a*-1 is a low-temperature substrate transfer, and the tweezer 125*a*-2 is a high-temperature substrate transfer. The heat resistance of the high-temperature tweezer 125*a*-2 may be a heat resistance of, for example, 100 degrees C. or higher, more specifically 200 degrees C. or higher. A mapping sensor may be installed at the low-temperature tweezer 125*a*-1. By installing the mapping sensor at the low-temperature tweezer 125*a*-1, it is possible to check the number of wafers 200 in the load port unit 106, the number of wafers 200 in the reaction chamber 201, and the number of wafers 200 in the cooling chamber 204.

In the substrate processing apparatus of the embodiments of the present disclosure, the tweezer 125*a*-1 is described as the low-temperature tweezer, and the tweezer 125*a*-2 is described as the high-temperature tweezer. However, the present disclosure is not limited thereto. The tweezer 125*a*-1 may be made of material such as alumina or quartz with high heat resistance and poor thermal conductivity, and may be used when transferring the wafer at a high temperature and a room temperature. The tweezer 125*a*-2 may be made of ordinary aluminum and may be used when transferring the wafer at a low temperature and a room temperature. Further, both the tweezers 125*a*-1 and 125*a*-2 may be made of material such as alumina or quartz with high heat resistance and low thermal conductivity.

(Process Furnace)

A process furnace (process chamber) 201 with a substrate processing structure as shown in FIG. 1 is installed in a region A surrounded by a broken line in FIG. 2. As shown in FIG. 3, a plurality of process furnaces are installed in the embodiments of the present disclosure. Since the structures of the process furnaces are the same, one process furnace will be described, and description of the other process furnaces will be omitted.

As shown in FIG. 1, the process furnace includes a case 102 as a cavity (process container) made of material such as metal that reflects electromagnetic waves. Further, a cap flange (closure plate) 104 made of metal material is configured to close an upper end of the case 102 via an O-ring as a seal (not shown). A space inside the case 102 and the cap flange 104 is mainly constituted as a process chamber 201 in which substrates such as silicon wafers are processed. A reaction tube (not shown) made of quartz that allows electromagnetic waves to pass therethrough may be installed inside the case 102, and the process container may be configured such that the inside of the reaction tube serves as a process chamber. Further, the process chamber 201 may be constituted by the case 102 with its ceiling closed, without installing the cap flange 104.

A mounting stand 210 is installed in the process chamber 201, and a boat 217 as a substrate holder configured to hold wafers 200 as substrates is mounted on an upper surface of the mounting stand 210. In the boat 217, wafers 200 to be processed and susceptors 103*a* and 103*b* arranged vertically above and below the wafers 200 to sandwich the wafers 200 are held at predetermined intervals. The susceptors 103*a* and 103*b* made of material such as a silicon plate (Si plate) or a silicon carbide plate (SiC plate) are arranged above and below the wafers 200, thereby suppressing concentration of an electric field intensity on edges of the wafers 200. That is, the susceptors suppresses absorption of electromagnetic waves by the edges of the wafers. Further, quartz plates 101*a* and 101*b* as heat insulating plates may be held at predetermined intervals on upper and lower surfaces of the susceptors 103*a* and 103*b*. In the embodiments of the present disclosure, the quartz plates 101*a* and 101*b* are made of the same components, and the susceptors 103*a* and 103*b* are made of the same components. Hereinafter, the quartz plates 101*a* and 101*b* and the susceptors 103*a* and 103*b* will be referred to as a quartz plate 101 and a susceptor 103 respectively, in a case where they may not be distinguished from each other while being described respectively.

A cross section of the case 102 as the process container is, for example, a circular cross section and is constituted as a flat closed container. Further, the transfer housing 202 as a lower container is made of, for example, metal material such as aluminum (Al) or stainless steel (SUS) or quartz. The space surrounded by the case 102 may be called a process chamber 201 or a reaction area 201 as a process space, and the space surrounded by the transfer housing 202 may be called a transfer chamber or a transfer area 203 as a transfer space. The process chamber 201 and the transfer chamber 203 are not limited to being horizontally adjacent to each other as in the embodiments of the present disclosure, but may be configured to be vertically adjacent to each other to move a substrate holder with a predetermined structure up or down.

As shown in FIGS. 1, 2 and 3, a substrate loading/unloading port 206 adjacent to the gate valve 205 is provided at a side surface of the transfer housing 202. The wafer 200 is moved between the process chamber 201 and the transfer chamber 203 via the substrate loading/unloading port 206. Around the gate valve 205 or the substrate loading/unloading port 206, a choke structure with a length of ¼ wavelength of the electromagnetic waves being used is installed as a countermeasure against electromagnetic wave leakage, which is described below.

An electromagnetic wave supplier as a heater, which is described below in detail, is installed at the side surface of the case 102. Electromagnetic waves such as microwaves supplied from the electromagnetic wave supplier are introduced into the process chamber 201 to heat the wafers 200 and the like, thereby processing the wafers 200.

The mounting stand 210 is supported by a shaft 255 as a rotary shaft. The shaft 255 passes through a bottom of the process chamber 201 and is connected to a driver 267 configured to perform a rotational operation outside the process chamber 201. By operating the driver 267 to rotate the shaft 255 and the mounting stand 210, it is possible to rotate the wafers 200 mounted on the boat 217. A lower end of the shaft 255 is covered with a bellows 212 such that the process chamber 201 and the transfer area 203 are kept airtight.

In this regard, the mounting stand 210 may be moved up or down by the driver 267 according to a height of the substrate loading/unloading port 206 such that the wafer 200 is located at a wafer transfer position when transferring the wafer 200, and the wafer 200 is located at a processing position (wafer processing position) in the process chamber 201 when processing the wafer 200.

An exhauster configured to exhaust an atmosphere in the process chamber 201 is installed at a lower side of the process chamber 201 and on an outer peripheral side of the mounting stand 210. As shown in FIG. 1, an exhaust port 221 is installed at the exhauster. An exhaust pipe 231 is connected to the exhaust port 221. A pressure regulator 244 such as an APC valve or the like that controls a valve opening state according to the pressure in the process chamber 201, and a vacuum pump 246 are connected in this order to the exhaust pipe 231 in series.

In this regard, the pressure regulator 244 is not limited to the APC valve as long as it may regulate an exhaust amount by receiving pressure information in the process chamber 201 and a feedback signal from a pressure sensor 245, which is described below. An ordinary opening/closing valve and a pressure regulating valve may be used in combination.

The exhauster (also referred to as an exhaust system or an exhaust line) mainly includes the exhaust port 221, the exhaust pipe 231, and the pressure regulator 244. Further, the exhaust port may be provided to surround the mounting stand 210 such that a gas may be exhausted from the entire periphery of the wafer 200. The vacuum pump 246 may be added to the structure of the exhauster.

At the cap flange 104, there is installed a gas supply pipe 232 configured to supply processing gases such as an inert gas, a precursor gas, and a reaction gas, which are used in various substrate processing processes, into the process chamber 201. At the gas supply pipe 232, a mass flow controller (MFC) 241 as a flow rate controller (flow rate control part) and a valve 243 as an opening/closing valve are installed in this order from the upstream side. For example, a gas source of a nitrogen ($N_2$) gas as an inert gas is connected to the upstream side of the gas supply pipe 232, and the nitrogen ($N_2$) gas is supplied into the process chamber 201 via the MFC 241 and the valve 243. When a plurality of types of gases are used when the substrate is processed, the gases may be supplied by adopting a structure where a gas supply pipe at which a MFC as a flow rate controller, and a valve as an opening/closing valve are installed in this order from the upstream side, is connected to the gas supply pipe 232 on the downstream side of the valve 243. A gas supply pipe at which a MFC and a valve are installed may be installed for each gas type.

A gas supply system (gas supplier) mainly includes the gas supply pipe 232, the MFC 241, and the valve 243. When the inert gas flows through the gas supply system, it is also called an inert gas supply system. As the inert gas, in addition to the $N_2$ gas, for example, a rare gas such as an Ar gas, a He gas, a Ne gas, or a Xe gas may be used.

A temperature sensor 263 as a non-contact temperature measuring apparatus is installed at the cap flange 104. By regulating an output of a microwave oscillator 655, which is described below, based on the temperature information detected by the temperature sensor 263, the substrate is heated, such that a temperature of the substrate temperature is within a desired temperature distribution. The temperature sensor 263 includes, for example, a radiation thermometer such as an IR (Infrared Radiation) sensor. The temperature sensor 263 is installed to measure a surface temperature of the quartz plate 101*a* or a surface temperature of the wafer 200. When the susceptor described above is provided as a heater, the temperature sensor 263 may be configured to measure a surface temperature of the susceptor. Further, in the embodiments of the present disclosure, the temperature of the wafer 200 (wafer temperature) may refer to a wafer temperature converted by temperature conversion data described below, that is, an estimated wafer temperature, a temperature obtained by directly measuring the temperature of the wafer 200 with the temperature sensor 263, or both of them.

Progresses of change in temperature of the quartz plate 101 or the susceptor 103 and the wafer 200 may be respectively obtained in advance by the temperature sensor 263, such that temperature conversion data indicating a correlation between the temperature of the quartz plate 101 or the susceptor 103 and the temperature of the wafer 200 may be stored in the memory 121*c* or the external memory 123. By providing the temperature conversion data in advance in this way, the temperature of the wafer 200 may be estimated by measuring the temperature of the quartz plate 101, and the output of the microwave oscillator 655, that is, the heater may be controlled based on the estimated temperature of the wafer 200.

Without being limited to the radiation thermometer described above, a thermocouple may be used or a thermocouple and a non-contact thermometer may be used together to measure the temperature of the substrate. However, when the temperature is measured by using the thermocouple, the thermocouple may be arranged near the wafer 200 to measure the temperature. That is, since the thermocouple may be to be arranged in the process chamber 201, the thermocouple itself may be heated by the microwaves supplied from the microwave oscillator, which is described below. This makes it impossible to accurately measure the temperature. Therefore, a non-contact thermometer may be used as the temperature sensor 263.

Further, the temperature sensor 263 is not limited to being installed at the cap flange 104 and may be installed at the mounting stand 210. Further, the temperature sensor 263 may be installed directly installed on the cap flange 104 or the mounting stand 210, or may be configured to indirectly measure the temperature by allowing a mirror or the like to reflect radiation light from a measurement window installed on the cap flange 104 or the mounting stand 210. Further, the number of temperature sensors 263 is not limited to one, and may be plural.

Electromagnetic wave introduction ports 653-1 and 653-2 are installed at the side wall of the case 102. One ends of waveguides 654-1 and 654-2 configured to supply electromagnetic waves (microwaves) into the process chamber 201 are connected to the electromagnetic wave introduction ports 653-1 and 653-2, respectively. Microwave oscillators (electromagnetic wave sources) 655-1 and 655-2 as heating sources configured to supply electromagnetic waves into the process chamber 201 to perform a heating operation are connected to the other ends of the waveguides 654-1 and 654-2, respectively. The microwave oscillators 655-1 and 655-2 supply electromagnetic waves such as microwaves to waveguides 654-1 and 654-2, respectively. Further, magnetron, klystron, and the like are used as the microwave oscillators 655-1 and 655-2. Hereinafter, the electromagnetic wave introduction ports 653-1 and 653-2, the waveguides 654-1 and 654-2, and the microwave oscillators 655-1 and 655-2 will be described as an electromagnetic wave introduction port 653, a waveguide 654, and a microwave oscillator 655, respectively, in a case where they may not be distinguished from each other while being described respectively.

A frequency of the electromagnetic waves generated by the microwave oscillator 655 may be controlled to be in a frequency range of, specifically, 13.56 MHz to 24.125 GHz. More specifically, the frequency may be controlled to be 2.45 GHz or 5.8 GHz. In this regard, the respective frequencies of the microwave oscillators 655-1 and 655-2 may be the same frequency, or may be different frequencies.

Further, in the embodiments of the present disclosure, two microwave oscillators 655 are arranged at the side surface of the case 102, but the present disclosure is not limited thereto. One or more microwave oscillators 655 may be installed. Further, the microwave oscillators 655 may be arranged to be installed at different side surfaces such as opposite side surfaces of the case 102. An electromagnetic wave supplier as a heater (also referred to as an electromagnetic wave supply apparatus, a microwave supplier, a microwave supply apparatus) mainly includes the microwave oscillators 655-1 and 655-2, the waveguides 654-1 and 654-2, and the electromagnetic wave introduction ports 653-1 and 653-2.

A controller 121, which is described below, is connected to each of the microwave oscillators 655-1 and 655-2. The temperature sensor 263 configured to measure the temperature of the quartz plate 101*a* or 101*b* or the wafer 200 accommodated in the process chamber 201 is connected to the controller 121. The temperature sensor 263 measures the temperature of the quartz plate 101 or the wafer 200 by the method described above and transmits the measured temperature to the controller 121. The controller 121 controls the outputs of the microwave oscillators 655-1 and 655-2 to control the heating of the wafer 200. Further, the method of controlling the heating by the heater includes a method of controlling the heating of the wafer 200 by controlling the voltage inputted to the microwave oscillator 655, a method of controlling the heating of the wafer 200 by changing a ratio of a time during which a power supply of the microwave oscillator 655 is turned on to a time during which the power supply is turned off, and the like.

In this regard, the microwave oscillators 655-1 and 655-2 are controlled by the same control signal sent from controller 121. However, the present disclosure is not limited thereto, and the microwave oscillators 655-1 and 655-2 may be individually controlled by transmitting individual control signals from the controller 121 to the respective microwave oscillators 655-1 and 655-2.

(Controller)

Figure 4:
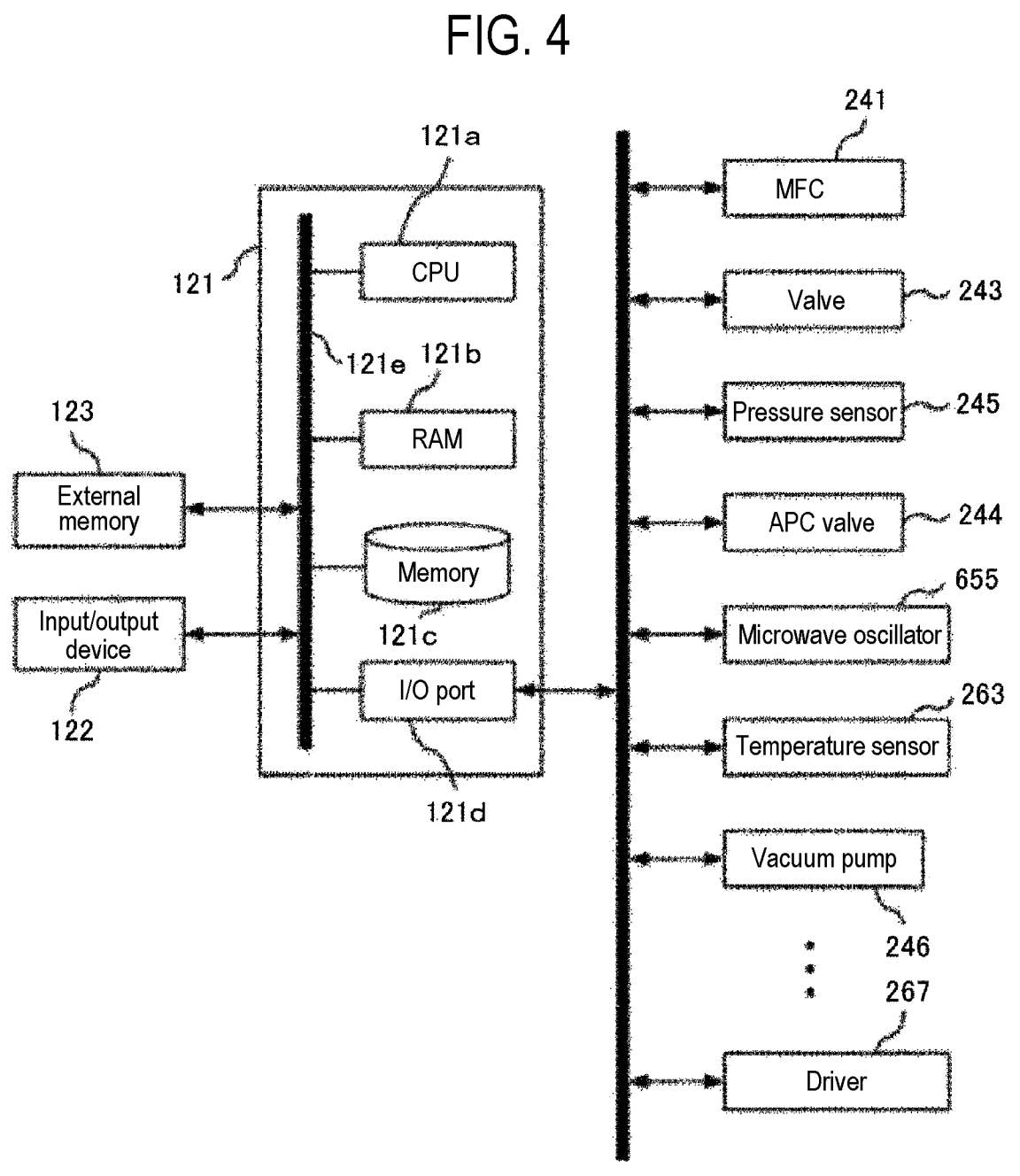

As shown in FIG. 4, the controller 121, which is a control part (control device, or control means or unit), is constituted as a computer that includes a CPU (Central Processing Unit) 121*a*, a RAM (Random Access Memory) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 constituted as, for example, a touch panel or the like is connected to the controller 121.

The memory 121*c* include, for example, a flash memory, a HDD (Hard Disk Drive), or the like. The memory 121*c* readably stores a control program that controls an operation of the substrate processing apparatus, a process recipe describing procedures and conditions in an annealing (modifying) process, and the like. The process recipe is a combination that causes the controller 121 to execute each procedure in the substrate processing process described below to obtain a predetermined result. The process recipe functions as a program. Hereinafter, the process recipe, the control program, and the like will be collectively and simply referred to as program. In addition, the process recipe may be simply referred to as recipe.

When the term "program" is used in the present disclosure, it may include the process recipe, the control program, or both of them. The RAM 121*b* is constituted as a memory area (work area) in which programs and data read by the CPU 121*a* are temporarily stored.

The I/O port 121*d* is connected to the transfer machine 125, the MFC 241, the valve 243, the pressure sensor 245, the APC valve 244, the vacuum pump 246, the temperature sensor 263, the driver 267, the microwave oscillator 655, and the like.

The CPU 121*a* is configured to read a control program from the memory 121*c* and execute the same. The CPU 121*a* is further configured to read a recipe from the memory 121*c* in response to an input of an operation command from the input/output device 122 or the like. The CPU 121*a* is configured to be capable of controlling, according to contents of the recipe thus read, the substrate transfer operation by the transfer machine, the flow rate regulation operation for various gases by the MFC 241, the opening/closing operation of the valve 243, the pressure regulation operation by the APC valve 244 based on the pressure sensor 245, the start/stop of the vacuum pump 246, the output regulation operation of the microwave oscillator 655 based on the temperature sensor 263, the rotation and rotation speed adjustment operation or elevating operation of the mounting stand 210 (or the boat 217) by the driver 267, and the like.

The controller 121 may be constituted by installing the above-described program stored in an external memory 123 (for example, a magnetic disk such as a HDD, an optical disk such as a CD, a magneto-optical disk such as a MO, or a semiconductor memory such as a USB) into a computer. The memory 121*c* and the external memory 123 are constituted as a computer-readable recording medium. Hereinafter, the memory 121*c* and the external memory 123 may be collectively and simply referred to as recording medium. When the term "recording medium" is used in the present disclosure, it may include the memory 121*c*, the external memory 123, or both of them. The program may be provided to the computer by using a communication means or unit such as the Internet or a dedicated line without using the external memory 123.

According to the embodiments of the present disclosure, it is possible to suppress wafer deformation due to cyclic microwave irradiation. In other words, by setting a power when preheating is performed to be stepwise at 3200 W, an amount of deformation of the wafer may be suppressed to within 5 mm. As used herein, the term "stepwise" means that the preheating is performed for 14 cycles (a total of 140 seconds), each of which includes an on-duration at 3200 W for 8 seconds and an off-duration at OW for 2 seconds. Due to the stepwise power, a temperature at the end of the susceptor also drops. Thereafter, the temperature of the substrate rises to about 600 degrees C. by irradiating microwaves for 150 seconds at 6 KW. The maximum amount of deformation of the Si wafer at this time is suppressed to fall within 5 mm.

FIG. 5 shows an example of a flow of substrate processing according to the embodiments of the present disclosure. Now, a process of manufacturing a semiconductor device by using the substrate processing apparatus described above, for example, an example of a method of modifying (crystallizing) an amorphous silicon film as a silicon-containing film formed on a substrate will be described along the processing flow shown in FIG. 5. In the following description, an operation of each component constituting the substrate processing apparatus is controlled by the controller described with reference to FIG. 4. When the word "wafer" is used herein, it may refer to a wafer itself, or a stacked body of a wafer and a predetermined layer or film formed on a surface of the wafer.

First, after a substrate discharging step (S801), a substrate loading step (S802) is performed such that the wafers 200 are loaded into a predetermined process chamber 201 by opening or closing the gate valve 205. That is, two wafers mounted on the low-temperature tweezer 125*a*-1 and the high-temperature tweezer 125*a*-2 are loaded into the process chamber 201.

(In-Furnace Pressure/Temperature Regulation Step (S803))

After the loading of the wafers 200 into the process chamber 201 is completed, the atmosphere in the process chamber 201 is controlled to a predetermined pressure (e.g., 10 to 102000 Pa). Specifically, while evacuating the process chamber 201 by the vacuum pump 246, a valve opening state of the pressure regulator 244 is feedback-controlled based on the pressure information detected by the pressure sensor 245 to set the pressure in the process chamber 201 to a predetermined pressure.

(Inert Gas Supply Step (S804))

After the pressure and temperature in the process chamber 2015 are controlled to predetermined values in the in-furnace pressure/temperature regulation step S803, the driver 267 rotates the shaft 255 to rotate the wafers 200 with the boat 217 on the mounting stand 210. At this time, an inert gas such as nitrogen gas is supplied via the gas supply pipe 232 (S804). Further, at this time, the pressure in the process chamber 201 is regulated to a predetermined value in the range of 10 Pa to 102000 Pa, for example, 101300 Pa to 101650 Pa. Further, the shaft may be rotated during the substrate loading step S402, that is, after the loading of the wafers 200 into the process chamber 201 is completed.

(Preheating Step (S805))

Subsequently, when the pressure in the process chamber 201 reaches a predetermined pressure, the microwave oscillator 655 supplies a first microwave into the process chamber 201 via the above-described respective components. A preheating process is performed in which, the wafers 200 are heated by performing, at a first microwave power (e.g., 3200 W), a process of supplying microwaves during an ON time (e.g., 8 seconds) and a process of stopping the supply of the microwaves during an OFF time (e.g., 2 seconds), which is shorter than the ON time, a predetermined number of times (14 times) or for a predetermined time (140 seconds). As a result, the temperature of the wafer may increase moderately, thereby preventing warpage or cracking of the wafer.

(Modifying Step (S806))

While maintaining the pressure in the process chamber 201 at a predetermined pressure, the microwave oscillator 655 supplies a second microwave (e.g., 6000 W) into the process chamber 201 for a predetermined time (e.g., 160 seconds) via the above-described respective components. By supplying the second microwave into the process chamber 201, the wafer 200 may be heated to a temperature of 100 degrees C. or more and 1000 degrees C. or less, specifically 400 degrees C. or more and 900 degrees C. or less, more specifically 500 degrees C. or more and 700 degrees C. or less. By performing a substrate processing at such a temperature, the wafer 200 is processed at a temperature at which the microwaves are efficiently absorbed, and a speed of the modifying process may be increased. In other words, in a case where the wafer is processed at a temperature higher than 1000 degrees C., the surface of the wafer may be altered, making it difficult for the wafer to absorb the microwave. Thus, it becomes difficult to heat the wafer. Therefore, the substrate may be processed in the temperature range described above.

By making the power during the preheating stepwise at 3200 W in the preheating step (S805), an amount of deformation of the wafer may be suppressed to within 5 mm. As used herein, the term "stepwise" means that the preheating is performed for 14 cycles (a total of 140 seconds), each of which includes an on-duration at 3200 W for 8 seconds and an off-duration at OW for 2 seconds. Due to the stepwise power, a temperature at the end of the susceptor also drops. Thereafter, the temperature of the substrate rises to about 600 degrees C. by irradiating the microwaves for 160 seconds at 6000 W in the modifying process (S806). The maximum amount of deformation of the Si wafer at this time is suppressed to fall within 5 mm.

(Substrate Unloading Step (S807))

After the pressure in the process chamber 201 is returned to the atmospheric pressure, the gate valve 205 is opened to spatially bring the process chamber 201 and the transfer chamber 203 into fluid communication with each other. Thereafter, one heated (processed) wafer 200 mounted on the boat 217 is unloaded to the transfer chamber 203 by the high-temperature tweezer 125*a*-2 of the transfer machine 125 (S807).

(Substrate Cooling Step (S808))

The one heated (processed) wafer 200 unloaded by the high-temperature tweezers 125*a*-2 is moved to the cooling chamber 204 by the continuous operation of the transfer 125*b* and the transfer elevator 125*c*. Two wafers 200 are mounted in the cooling chamber 108 by the high-temperature tweezer 125*a*-2 and cooled for a predetermined time (S808).

(Substrate Accommodating Step (S809))

The two wafers 200 cooled in the substrate cooling step S808 are discharged from the cooling chamber 108 and transferred to a predetermined pod.

In the above description of the embodiments of the present disclosure, the first microwave power is 3200 W. However, the first microwave power may be 2000 W to 4000 W. When the first power is 2000 W to 4000 W, a time from when the wafer starts warping to when the warpage reaches its maximum state and then is settled down may be shortened. When the first power is less than 2000 W, it may take too long before the temperature of the wafer starts rising. Further, when the first power is higher than 4000 W, the temperature of the wafer may rise rapidly and the warpage of the wafer may become excessive, which may cause the wafer to contact with other wafers.

Further, in the above description of the embodiments of the present disclosure, the second microwave power is 6000 W. However, the second microwave power may be 4000 W to 12000 W. When the second microwave power is 4000 W to 12000 W, a process wafer may be regulated to reach a temperature which is proper for treatment. When the second microwave power is less than 4000 W, a long time may be taken for the treatment or the processing may be insufficient. Further, when the second microwave power is higher than 12000 W, depending on the number of wafers to be processed at one time, discharge or plasma may be generated over a microwave absorption limit of the wafer.

On the other hand, as for the first microwave, the on-duration of the microwave is 8 seconds, and the off-duration of the microwave is 2 seconds. The on-duration may be 5 seconds to 20 seconds, and the off-duration may be 1 second to 5 seconds. When the on-duration is 5 seconds to 20 seconds, is that it is possible to rapidly raise the temperature while suppressing the warpage of the wafer. When the on-duration is shorter than 5 seconds, it may be difficult to warm up the wafer, and when the on-duration is longer than 20 seconds, the temperature of the wafer may rise rapidly such that the warpage of the wafer becomes large, which may cause the wafer to contact with other wafers. Furthermore, when the off-duration is 1 to 5 seconds, the wafer may not be cooled too much and the warpage of the wafer may be suppressed. When the off-duration is shorter than 1 second, temperature equalization time may be insufficient. When the off-duration is longer than 5 seconds, it may take time to restore the temperature due to excessive cooling.

Further, although the modifying process time (annealing process time) is 160 seconds, it may be 60 seconds to 1800 seconds. When the modifying process time is 60 seconds to 1800 seconds, although it is desired to shorten the process time corresponding to the treatment process under development, the process time may tend to be long in reality. When the modifying process time is shorter than 60 seconds, it may be difficult to secure the in-plane uniformity of the wafer. When the modifying process time is longer than 1800 seconds, a throughput may deteriorate.

According to the apparatus according to the embodiments of the present disclosure described above, the microwaves are cyclically irradiated to make the in-plane temperature distribution of the semiconductor substrate uniform, such that the heat conduction is promoted in the semiconductor substrate when the microwaves are weak or off to reduce the temperature difference on the semiconductor substrate, which makes it possible to suppress occurrence of warpage and cracking of the semiconductor substrate and suppress the semiconductor substrates from contacting each other. Furthermore, by the cyclic irradiation, it is possible to irradiate high-power microwaves while keeping the temperature of the semiconductor substrate low, and it is possible to cope with semiconductor substrates with temperature restrictions.

The embodiments described above may be modified as appropriate, and effects thereof may also be obtained. For example, in the above description, there is described the process of modifying the amorphous silicon film into the polysilicon film as a film containing silicon as a main component, but the present disclosure is not limited thereto. A gas containing at least one selected from the group of oxygen (O), nitrogen (N), carbon (C), and hydrogen (H) may be supplied to modify the film formed on the surface of the wafer 200. For example, when a hafnium oxide film ($Hf_xO_y$ film) as a high-dielectric film is formed on the wafer 200, oxygen deficient in the hafnium oxide film may be replenished and characteristics of the high-dielectric film may be improved by supplying microwaves to heat the hafnium oxide film while supplying a gas containing oxygen.

Although the hafnium oxide film is described herein, the present disclosure is not limited thereto. The present disclosure may be suitably applied to a case of modifying a metal-based oxide film containing a metal element including at least one selected from the group of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W), and the like. That is, the above-described film-forming sequence may be suitably applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AIO film, a MoOCN film, a MoOC film, a MoON film, a MoO film, a WOCN film, a WOC film, a WON film, or a WO film on the wafer 200.

Moreover, a film mainly containing silicon as a main component and doped with impurities as well as the high-dielectric film may be heated. Examples of the film containing silicon as a main component include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film), and the like. Impurities include, for example, at least one selected from the group of bromine (B), carbon (C), nitrogen (N), aluminum (Al), phosphorus (P), gallium (Ga), arsenic (As), and the like.

Moreover, the film to be modified may be a resist film based on at least one selected from the group of a polymethyl methacrylate (PMMA) resin, an epoxy resin, a novolac resin, a polyvinyl phenyl resin, and the like.

In the above description, a process of manufacturing a semiconductor device is described, but the present disclosure is not limited thereto. The present disclosure may be applied to substrate processing techniques such as a patterning process in a liquid crystal panel manufacturing method, a patterning process in a solar cell manufacturing method, a patterning process in a power apparatus manufacturing method, and the like.

The present disclosure is not limited to the embodiments described above, and may further include various modifications. For example, the above-described embodiments are described in detail to explain the present disclosure in an easy-to-understand manner, and may not be limited to those including the entirety of structures described above.

Furthermore, the above-described structures, functions, controller, which is a control part, and the like are mainly described by using examples of creating a program that implements a portion or an entirety of them, but a portion or the entirety of them may be realized by hardware, for example, by designing the portion or the entirety of them as an integrated circuit. That is, a function of an entirety or a portion of a processor may be realized by an integrated circuit such as an ASIC (Application Specific Integrated Circuit), a FPGA (Field Programmable Gate Array), or the like instead of programs.

According to the present disclosure in some embodiments, it is possible to prevent warpage or cracking of a substrate due to a heat treatment.

While certain embodiments are described above, these embodiments are presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:

a process chamber in which a substrate is processed;

a microwave oscillator configured to supply microwaves to the process chamber; and a controller configured to be capable of controlling the microwave oscillator to perform:

a heating process in which the substrate is heated with a first microwave, among the supplied microwaves, supplied to the substrate at a first microwave power so that a process of supplying the first microwave during a predetermined supply time and a process of stopping the supply of the first microwave during a predetermined stop time, which is shorter than the predetermined supply time, are performed a predetermined number of times or for a first predetermined time; and after the heating process, a modifying process in which the substrate is continuously supplied with a second microwave, among the supplied microwaves, at a second microwave power, which is higher than the first microwave power, for a second predetermined time while maintaining the second microwave power, wherein the second predetermined time for the modifying process is longer than the predetermined supply time in the heating process.

2. The substrate processing apparatus of claim 1, wherein the first microwave power is between 2000 W and 4000 W.

3. The substrate processing apparatus of claim 2, wherein the second microwave power is between 4000 W and 12000 W.

4. The substrate processing apparatus of claim 1, wherein the predetermined supply time is 5 to 20 seconds.

5. The substrate processing apparatus of claim 1, wherein the predetermined stop time is 1 to 5 seconds.

6. The substrate processing apparatus of claim 1, wherein the second predetermined time for which the modifying process is performed is 60 seconds to 1800 seconds.

7. The substrate processing apparatus of claim 1, wherein an amorphous silicon film is formed on the substrate.

8. The substrate processing apparatus of claim 1, wherein the process of supplying the first microwave during the predetermined supply time and the process of stopping the supply of the first microwave during the predetermined stop time are repeated a predetermined number of times or for a predetermined time.

9. A method of manufacturing a semiconductor device, comprising:

loading a substrate into a process chamber of a substrate processing apparatus;

heating the substrate with a first microwave, among microwaves supplied to the process chamber, supplied at a first microwave power by performing a process of supplying the first microwave during a predetermined supply time and a process of stopping the supply of the first microwave during a predetermined stop time, which is shorter than the predetermined supply time, a predetermined number of times or for a first predetermined time; and after the act of heating the substrate, modifying the substrate by continuously supplying a second microwave, among the supplied microwaves, at a second microwave power, which is higher than the first microwave power, to the substrate for a second predetermined time while maintaining the second microwave power, wherein the second predetermined time for the modifying process is longer than the predetermined supply time in the heating process.

10. The method of claim 9, wherein the first microwave power is between 2000 W and 4000 W.

11. The method of claim 10, wherein the second microwave power is between 4000 W and 12000 W.

12. The method of claim 9, wherein the predetermined supply time is 5 to 20 seconds.

13. The method of claim 9, wherein the predetermined stop time is 1 to 5 seconds.

14. The method of claim 9, wherein the second predetermined time for which the modifying is performed is 60 seconds to 1800 seconds.

15. The method of claim 9, wherein the process of supplying the first microwave during the predetermined supply time and the process of stopping the supply of the first microwave during the predetermined stop time are repeated a predetermined number of times or for a first predetermined time.

16. A non-transitory computer-readable recording medium storing a program that causes, by a computer, a substrate processing apparatus to perform a process comprising:

loading a substrate into a process chamber of the substrate processing apparatus;

heating the substrate with a first microwave, among microwaves supplied to the process chamber, supplied at a first microwave power by performing a process of supplying the first microwave during a predetermined supply time and a process of stopping the supply of the first microwave during a predetermined stop time, which is shorter than the predetermined supply time, a predetermined number of times or for a first predetermined time; and after the act of heating the substrate, modifying the substrate by continuously supplying a second microwave, among the supplied microwaves, at a second microwave power, which is higher than the first microwave power, to the substrate for a second predetermined time while maintaining the second microwave power, wherein the second predetermined time for the modifying process is longer than the predetermined supply time in the heating process.

17. The non-transitory computer-readable recording medium of claim 16, wherein the first microwave power is between 2000 W and 4000 W.

18. The non-transitory computer-readable recording medium of claim 17, wherein the second microwave power is between 4000 W and 12000 W.

19. The non-transitory computer-readable recording medium of claim 16, wherein the predetermined supply time is 5 to 20 seconds.

20. The non-transitory computer-readable recording medium of claim 16, wherein the predetermined stop time is 1 to 5 seconds.

21. The non-transitory computer-readable recording medium of claim 16, wherein the process of supplying the first microwave during the predetermined supply time and the process of stopping the supply of the first microwave during the predetermined stop time are repeated a predetermined number of times or for a first predetermined time.

* * * * *